(12) United States Patent
Sumi (10) Patent No.: US 12,500,078 B2
(45) Date of Patent: Dec. 16, 2025

(54) SUBSTRATE PROCESSING METHOD AND SUBSTRATE PROCESSING APPARATUS (71) Applicant: SCREEN Holdings Co., Ltd., Kyoto (JP)

(72) Inventor: Noritake Sumi, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 155 days.

(21) Appl. No.: 18/551,539

(22) PCT Filed: Mar. 16, 2022

(86) PCT No.: PCT/JP2022/011881
§ 371 (c)(1),
(2) Date: Sep. 20, 2023

(87) PCT Pub. No.: WO2022/202527
PCT Pub. Date: Sep. 29, 2022

(65) Prior Publication Data
US 2024/0170275 A1 May 23, 2024

(30) Foreign Application Priority Data
Mar. 23, 2021 (JP) ................................ 2021-048371

(51) Int. Cl.
*H01L 21/02* (2006.01)
*B08B 7/00* (2006.01)
*H01L 21/67* (2006.01)

(52) U.S. Cl.
CPC ...... *H01L 21/02101* (2013.01); *B08B 7/0021* (2013.01); *H01L 21/67034* (2013.01)

(58) Field of Classification Search
None
See application file for complete search history.

(56) References Cited

U.S. PATENT DOCUMENTS

| 2017/0148624 A1 | 5/2017 | Verhaverbeke et al. |
| 2018/0138058 A1 | 5/2018 | Egashira et al. |
| 2018/0264504 A1* | 9/2018 | Egashira ........... H01L 21/02101 |

FOREIGN PATENT DOCUMENTS

| JP | H10-165911 A | 6/1998 |
| JP | 2001-176837 A | 6/2001 |

(Continued)

OTHER PUBLICATIONS

International Search Report mailed Jun. 7, 2022 in corresponding PCT International Application No. PCT/JP2022/011881.

(Continued)

*Primary Examiner* — Kaj K Olsen
*Assistant Examiner* — Pradhuman Parihar
(74) *Attorney, Agent, or Firm* — OSTROLENK FABER LLP (57) ABSTRACT

In a substrate processing method according to this invention, a decompression process after processing a substrate using a fluid in a supercritical state in a chamber is divided into two stages. In the first decompress step, an internal space of the chamber is decompressed to a pressure lower than the critical pressure and higher than an atmospheric pressure while keeping the temperature of the internal space equal to or higher than a critical temperature of the processing fluid. In the second decompression step, the processing fluid is discharged at a discharge rate higher than in the first decompression step, thereby the internal space is decompressed. At this time, the discharge rate is so controlled that the temperature of the internal space when the pressure of the internal space is reduced to the atmospheric pressure becomes a predetermined target temperature.

10 Claims, 4 Drawing Sheets

(56) References Cited

FOREIGN PATENT DOCUMENTS

| | | |
|---|---|---|
| JP | 2010-174071 A | 8/2010 |
| JP | 2018-81966 A | 5/2018 |
| JP | 2018-152479 A | 9/2018 |

OTHER PUBLICATIONS

Taiwan Office Action mailed Nov. 2, 2022 in corresponding Taiwanese Application No. 111110267.
Office Action issued Sep. 27, 2024 for corresponding Korean Patent Application No. 10-2023-7030546.

* cited by examiner

SUBSTRATE PROCESSING METHOD AND SUBSTRATE PROCESSING APPARATUS

CROSS REFERENCE TO RELATED APPLICATION

The disclosure of Japanese Patent Application No. 2021-048371 filed on Mar. 23, 2021 including specification, drawings and claims is incorporated herein by reference in its entirety.

TECHNICAL FIELD

This invention relates to a technique for processing a substrate in a chamber with a processing fluid in a supercritical state and particularly, a process for discharging the processing fluid from the chamber.

BACKGROUND ART

The process of processing various substrates such as a semiconductor substrate and a glass substrate for a display apparatus includes processing the surface of the substrate with various processing fluids. Although processing using liquids such as chemicals and rinses as the processing fluids has been widely performed in the past, processing using supercritical fluids has been put into practical use in recent years. In particular, in the processing of a substrate having a fine pattern formed on its surface, a supercritical fluid having a lower surface tension than a liquid penetrates deep into gaps among the pattern, whereby the processing may be performed efficiently. In addition, the risk of pattern collapse due to the surface tension may be reduced in a drying process.

A substrate processing apparatus for drying a substrate by replacing a liquid adhering to the substrate by a supercritical fluid is described, for example, in PTL 1. More specifically, a flow of a drying process in the case of using carbon dioxide as a supercritical fluid and IPA (isopropyl alcohol) as a liquid to be replaced by carbon dioxide is described in detail in PTL 1. In this process, the inside of a chamber accommodating the substrate is filled with the processing fluid and a condition exceeding critical pressure and critical temperature of the processing fluid in the chamber is kept for a certain period. Thereafter, the inside of the chamber is decompressed and a series of processing ends.

CITATION LIST

Patent Literature

PTL 1: JP 2018-081966A

SUMMARY

Technical Problem

In the above conventional technique, the supercritical state is maintained mainly by a pressure control of repeating pressure increase and pressure reduction. However, the temperature and the pressure of the supercritical fluid during the processing are more preferably kept constant. The reason for that is that, since a density change particularly associated with a temperature change is very large in the supercritical fluid, processing efficiency is largely changed by a density of the processing fluid in a processing for the purpose of liquid replacement. More particularly, the higher density the supercritical processing fluid is, the more the other liquid can be taken. Thus, the replacement efficiency of the liquid increases. The lower the temperature, the higher the density of the supercritical processing fluid. Thus, the processing fluid preferably has as low and constant a temperature as possible within a range in which the supercritical state can be maintained.

The temperature of the processing fluid is affected also by a chamber internal temperature when the processing fluid is introduced into the chamber. Thus, the temperature in the chamber at the time of introducing the processing fluid is also required to be constantly and properly kept. However, this point is not considered in the above conventional technique, and the chamber internal temperature is not managed at timings other than during the processing, particularly in a decompression process. Thus, particularly in the case of successively processing a plurality of substrates, the next substrate and the processing fluid may be possibly introduced into the chamber having reached a high temperature by the processing of the previous substrate. In this way, processing efficiency may be reduced or processing results may vary.

Solution to Problem

This invention was developed in view of the above problem and, in a technique for processing the substrate by a processing fluid in a supercritical state in a chamber, aims to provide a technique capable of also obtaining stable processing efficiency particularly in the case of successively processing a plurality of substrates by properly managing a temperature in the chamber after a processing.

One aspect of this invention is directed to a substrate processing method for processing a substrate by a processing fluid in a supercritical state in a chamber, the substrate processing method including a supercritical process step of introducing the processing fluid into an internal space of the chamber accommodating the substrate and processing the substrate by keeping a pressure of the internal space higher than a critical pressure of the processing fluid and keeping a temperature of the internal space higher than a critical temperature of the processing fluid, a first decompression step of decompressing the internal space to a pressure lower than the critical pressure and higher than an atmospheric pressure while keeping the temperature of the internal space equal to or higher than the critical temperature by discharging the processing fluid from the chamber, and a second decompression step of decompressing the internal space by discharging the processing fluid at a discharge rate higher than in the first decompression step. Here, in the second decompression step, the discharge rate is so controlled that the temperature of the internal space when the pressure of the internal space is reduced to the atmospheric pressure becomes a predetermined target temperature.

Further, another aspect of this invention is directed to a substrate processing apparatus for processing a substrate by a processing fluid in a supercritical state, the substrate processing apparatus including a chamber having an internal space for accommodating the substrate, a fluid supplier for supplying the processing fluid into the internal space of the chamber, a fluid discharger for discharging the processing fluid from the internal space, and a controller for controlling the fluid supplier and the fluid discharger. The controller controls the fluid supplier to supply the processing fluid into the internal space, thereby a pressure of the internal space is kept higher than a critical pressure of the processing fluid and a temperature of the internal space is kept higher than a critical temperature of the processing fluid, the fluid discharger to discharge the processing fluid from the chamber to decompress the internal space to a pressure lower than the critical pressure and higher than an atmospheric pressure while keeping the temperature of the internal space equal to or higher than the critical temperature, and the fluid discharger to increase a discharge rate of the processing fluid to decompress the internal space to the atmospheric pressure, the discharge rate being set such that the temperature of the internal space when the pressure of the internal space is reduced to the atmospheric pressure becomes a predetermined target temperature.

The "discharge rate" mentioned here represents a mass per unit time of the processing fluid discharged from the chamber.

In the invention thus configured, a process for discharging the processing fluid to the outside of the chamber, after the processing of the substrate by the processing fluid in the supercritical state having both the pressure and the temperature beyond a critical point, is divided into two stages. That is, in the first stage, the inside of the chamber is decompressed to the pressure lower than the critical pressure while being kept at or above the critical temperature. In this way, the processing fluid transitions from the supercritical state to a gas phase without via a liquid phase. Thus, even if the substrate is formed with a fine pattern, a problem of pattern collapse due to a phase change from the liquid phase to the gas phase is avoided.

A mode of decompression from a state where the inside of the chamber is filled with the processing fluid having a pressure equal to or lower than the critical pressure and in the gas phase can be said to have a relatively high degree of freedom as long as a phase transition to the liquid phase does not occur. For example, the inside of the chamber may be decompressed to the atmospheric pressure by immediately discharging the processing fluid remaining in the chamber. By doing so, a time for taking out the substrate after the processing from the chamber can be shortened.

In contrast, in the second stage of the decompression process of the invention, the temperature in the chamber at a processing end time is managed, utilizing an adiabatic expansion occurring in the chamber in discharging the processing fluid. Specifically, the processing fluid in the chamber is expanded in a short time to cause the adiabatic expansion by discharging the processing fluid at a discharge rate higher than during the decompression in the first stage described above. In this way, the temperature of the internal space of the chamber is reduced. Here, the "temperature of the internal space" is desirably a concept indicating the temperature of a surface of a member facing the internal space, e.g. a chamber wall surface. However, this temperature can be more simply represented by the temperature of the fluid in the chamber.

In the decompression in the second stage, the discharge rate is so controlled that the internal temperature is the predetermined target temperature when the internal space is decompressed to the atmospheric pressure. Accordingly, the temperature in the chamber is the target temperature when the inside of the chamber is decompressed to the atmospheric pressure. By managing the decompression using the temperature of the internal space of the chamber as an index as just described, the inside of the chamber at the decompression end time can be kept at a proper temperature. In this way, the temperature in the chamber when the processing of each substrate is started can be kept constant even in the case of consecutively processing a plurality of substrates. As a result, processing results can be stabilized by suppressing a temperature variation of the processing fluid to be introduced.

Advantageous Effects of Invention

As described above, in the invention, the progress of the decompression is managed using the temperature in the chamber as an index for the decompression after a transition of the processing fluid in the chamber from the supercritical state to the gas phase. Thus, the temperature in the chamber can be properly managed after the processing of one substrate is finished. Particularly also in the case of successively processing a plurality of substrates, stable processing efficiency can be obtained by suppressing a temperature variation of the supercritical processing fluid for each processing.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

DESCRIPTION OF EMBODIMENTS

Figure 1:
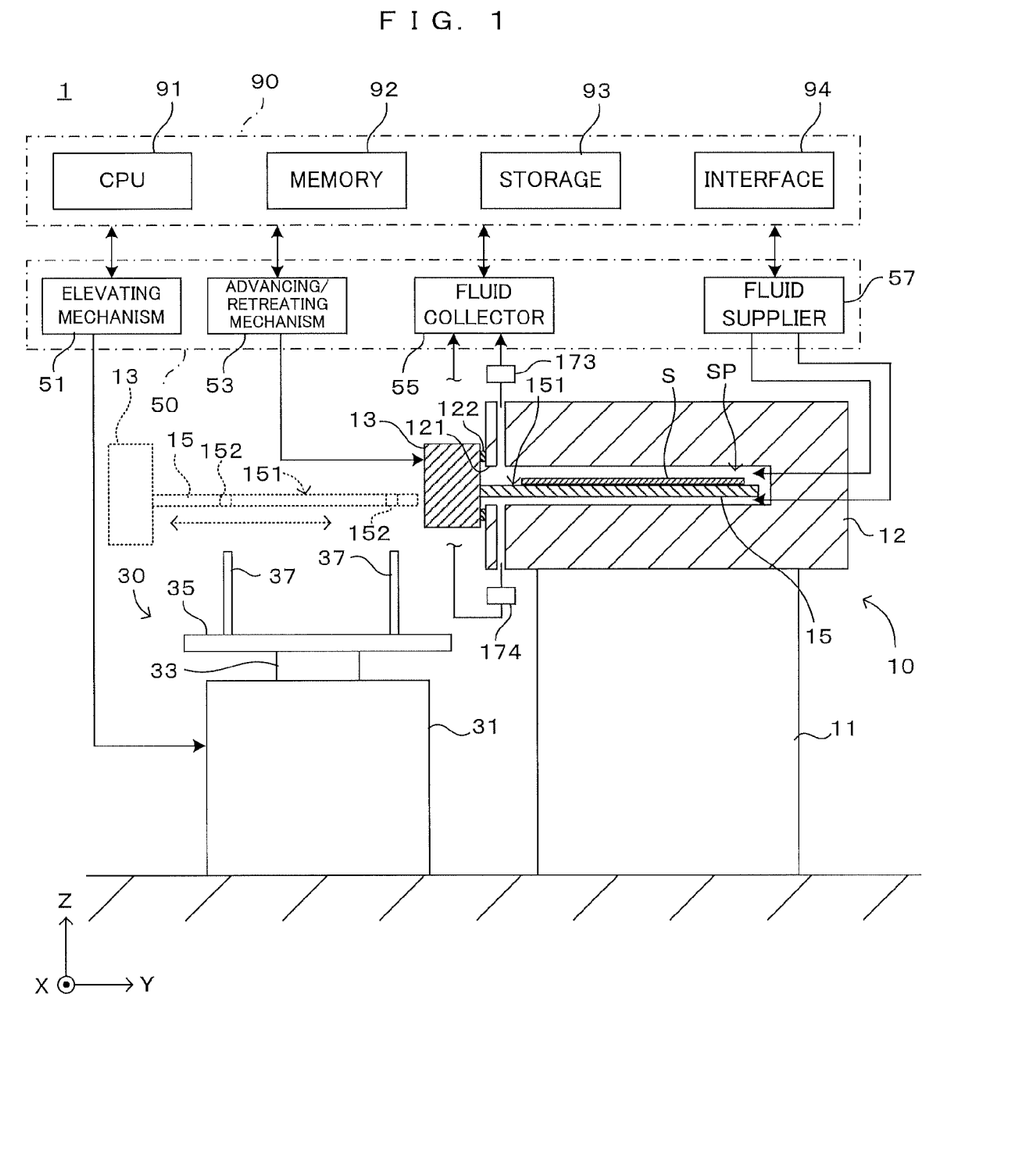
FIG. 1 is a drawing showing a schematic configuration of a substrate processing apparatus according to the present invention.

FIG. 1 is a drawing showing a schematic configuration of a substrate processing apparatus according to the present invention. This substrate processing apparatus 1 is an apparatus for processing surfaces of various substrates such as semiconductor substrates using supercritical fluids. Its device construction is preferably capable of performing a replacement end time determination method and a substrate processing method according to the present invention. To show directions in each figure in a unified manner below, an XYZ orthogonal coordinate system is set as shown in FIG. 1. Here, an XY plane represents a horizontal plane and a Z direction represents a vertical direction. More specifically, a (−Z) direction represents a vertically downward direction.

Various substrates such as semiconductor wafers, glass substrates for photomask, glass substrates for liquid crystal display, glass substrates for plasma display, substrates for FED (Field Emission Display), substrates for optical disk, substrates for magnetic disk, and substrates for magneto-optical disk can be adopted as the "substrate" in this embodiment. A substrate processing apparatus used to process a disk-shaped semiconductor wafer is mainly described as an example with reference to the drawings. But the substrate processing apparatus can be adopted also to process various substrates illustrated above. Also as a shape of the substrate, various types are applicable.

The substrate processing apparatus 1 includes a processing unit 10, a transfer unit 30, a supply unit 50 and a control unit 90. The processing unit 10 serves as an execution subject of a supercritical drying process. The transfer unit 30 receives an unprocessed substrate S transported by an external conveying device not shown in the figure and carries the substrate S into the processing unit 10. Further, the transfer unit 30 delivers a processed substrate S from the processing unit 10 to the external conveying device. The supply unit 50 supplies chemical substances, power, energy and the like necessary for the process to the processing unit 10 and the transfer unit 30.

The control unit 90 realizes a predetermined process by controlling these components of the apparatus. For this purpose, the control unit 90 includes a CPU 91, a memory 92, a storage 93, an interface 94, and the like. The CPU 91 executes various control programs. The memory 92 temporarily stores processing data. The storage 93 stores the control programs to be executed by the CPU 91. The interface 94 exchanges information with a user and an external apparatus. Operations of the apparatus to be described later are realized by the CPU 91 causing each component of the apparatus to perform a predetermined operation by executing the control program written in the storage 93 in advance.

The processing unit 10 has a structure in which a processing chamber 12 is settled on a pedestal 11. The processing chamber 12 is structured by a combination of several metal blocks which form a hollow inside serving as a processing space SP. A substrate S to be processed is carried into the processing space SP to be processed. A slit-like aperture 121 elongated in an X direction is formed in a (−Y) side surface of the processing chamber 12. The processing space SP communicates with an outside space via the aperture 121. That is, the processing SP is a hollow having a cross-sectional shape that is long in the X direction and short in the Z direction and elongated in the Y direction.

A lid member 13 is provided on the (−Y) side surface of the processing chamber 12 to close the aperture 121. A hermetic processing chamber is constructed by closing the aperture 121 of the processing chamber when the aperture 121 is closed by the lid member 13. By doing so, a processing to the substrate S under a high pressure in the internal processing space SP is allowed. A support tray 15 in the form of a flat plate is attached in a horizontal posture to a (+Y) side surface of the lid member 13. An upper surface 151 of the support tray 15 serves as a support surface on which the substrate S can be placed. The lid member 13 is supported horizontally movably in a Y direction by an unillustrated support mechanism.

The lid member 13 is movable toward and away from the processing chamber 12 by an advancing/retreating mechanism 53 provided in the supply unit 50. Specifically, the advancing/retreating mechanism 53 includes a linear motion mechanism such as a linear motor, a linear guide, a ball-screw mechanism, a solenoid or an air cylinder. Such a linear motion mechanism moves the lid member 13 in the Y direction. The advancing/retreating mechanism 53 operates in response to a control command from the control unit 90.

By a movement of the lid member 13 in a (−Y) direction, the lid member 13 separates away from the processing chamber 12. If the support tray 15 is pulled out from the processing space SP to outside via the aperture 121 as shown by the dotted lines, the support tray 15 is accessible from outside. Specifically, it becomes possible to place the substrate S on the support tray 15 and take out the substrate S placed on the support tray 15. On the other hand, the lid member 13 moves in a (+Y) direction, whereby the support tray 15 is accommodated into the processing space SP. If the substrate S is placed on the support tray 15, the substrate S is carried into the processing space SP together with the support tray 15.

The lid member 13 moves in the (+Y) direction to close the aperture 121, whereby the processing space SP is sealed. A sealing member 122 is provided between the (+Y) side surface of the lid member 13 and the (−Y) side surface of the processing chamber 12 and an airtight state of the processing space SP is maintained. The seal member 12 is made of rubber material, for example. Further, the lid member 13 is fixed to the processing chamber 12 by an unillustrated lock mechanism. As described above, in this embodiment, the lid member 13 is switched between a closing state (solid line) to close the aperture 121 and seal the processing space SP and a separating state (dotted line) to enable the substrate S to pass through by separating widely from the aperture 121.

The substrate S is processed in the processing space SP with the airtight state of the processing space SP ensured. In this embodiment, a fluid of a substance usable for a supercritical process, e.g. carbon dioxide, is sent from a fluid supplier 57 provided in the supply unit 50 as the processing fluid. The processing fluid is supplied to the processing unit 10 in a gaseous, liquid or supercritical state. Carbon dioxide is a chemical substance suitable for the supercritical drying process in having properties of entering a supercritical state at relatively low temperature and low pressure and dissolving an organic solvent often used in substrate processing well. At a critical point of carbon dioxide at which the fluid comes into the supercritical state, a pressure (critical pressure) is 7.38 MPa and a temperature (critical temperature) is 31.1° C.

The processing fluid is filled into the processing space SP. When suitable temperature and pressure are reached in the processing space SP, the processing space SP is filled with the processing fluid in the supercritical state. In this way, the substrate S is processed by the supercritical fluid in the processing chamber 12. The supply unit 50 is provided with a fluid collector 55, and the fluid after the process is collected into the fluid collector 55. The fluid supplier 57 and the fluid collector 55 are controlled by the control unit 90.

The processing space SP has a shape and a volume capable of receiving the support tray 15 and the substrate S supported by the support tray 15. That is, the processing space SP has a substantially rectangular cross-sectional shape wider than a width of the support tray 15 in a horizontal direction and larger than the sum of heights of the support tray 15 and the substrate S in the vertical direction and has a depth capable of receiving the support tray 15. As just described, the processing space SP has a shape and a volume enough to receive the support tray 15 and the substrate S. However, gaps between the support tray 15 and the substrate S and the inner wall surface of the processing space SP are tiny. Therefore, the amount of the processing fluid necessary to fill the processing space SP is relatively small.

With the support tray 15 accommodated in the processing space SP, the processing space SP is largely divided into two, i.e. spaces above and below the support tray 15. If the substrate S is placed on the support tray 15, the processing space SP is divided into a space above the upper surface of the substrate S and a space below the lower surface of the support tray 15.

The fluid supplier 57 supplies the processing fluid to each of the space above the substrate S and the space below the support tray 15, out of the processing space SP, on a (+Y) side further than a (+Y) side end part of the substrate S. On the other hand, the fluid collector 55 discharges the processing fluid from each of the space above the substrate S and the space below the support tray 15, out of the processing space SP, on a (−Y) side further than a (−Y) side end part of the substrate S. In this way, laminar flows of the processing fluid from the (+Y) side toward the (−Y) side are respectively formed above the substrate S and below the support tray 15 in the processing space SP.

Detectors 173, 174 for detecting a pressure and a temperature of the processing fluid discharged from the processing space SP are provided in pipes serving as discharge paths of the processing fluid from the processing space SP to the fluid collector 55. Specifically, the first detector 173 is provided in the pipe communicating with a space above the support tray 15, out of the processing space SP, and configured to discharge the processing fluid from this space. Further, the second detector 174 is provided in the pipe communicating with a space below the support tray 15 and configured to discharge the processing fluid from this space.

The detectors 173, 174 are for detecting the pressure and temperature of the processing space SP. In this sense, the detectors 173, 174 are desirably provided inside the processing space SP. Particularly for the temperature, it is ideal if the temperature of a chamber inner wall surface facing the processing space SP can be detected. However, it has to be avoided that the detectors 173, 174 hinder a smooth flow of the processing fluid or become a contamination source for the processing fluid. Thus, as a simple alternative method, the detectors 173, 174 are provided in processing fluid flow passages communicating with the processing space SP on a side downstream of the substrate S in a flowing direction of the processing fluid. That is, pressure and temperature detection results of the processing fluid flowing in these flow passages are regarded as the pressure and temperature of the processing space SP.

To this end, the pipes constituting the flow passages of the processing fluid from the processing space SP to the detectors 173, 174 desirably have a small pressure loss. Further, detectors may be arranged to directly face the processing space SP as long as these do not affect the flow of the processing fluid.

The control unit 90 specifies the pressure and temperature in the processing space SP based on outputs of the detectors 173, 174, and controls the fluid supplier 57 and the fluid collector 55 based on those results. In this way, the supply of the processing fluid into the processing space SP and the discharge of the processing fluid from the processing space SP are properly managed. As a result, the pressure and temperature in the processing space SP are adjusted according to a processing recipe determined in advance.

The transfer unit 30 transfers the substrate S between an external conveying device and the support tray 15. To this end, the transfer unit 30 is provided with a body 31, an elevating member 33, a base member 35 and a plurality of lift pins 37. The elevating member 33 is a columnar member extending in the Z direction, and supported movably in the Z direction with respect to the body 31 by an unillustrated supporting mechanism. The base member 35 having a substantially horizontal upper surface is mounted atop the elevating member 33. The plurality of lift pins 37 stand upward from the upper surface of the base member 35. Each of the lift pins 37 supports the substrate S in a horizontal posture from below by the contact of an upper end part thereof with the lower surface of the substrate S. To stably support the substrate S in the horizontal posture, it is desirable to provide three or more lift pins 37 having the upper end parts located at the same height.

The elevating member 33 is movable up and down by an elevating mechanism 51 provided in the supply unit 50. Specifically, the elevating mechanism 51 includes a linear motion mechanism such as a linear motor, a linear motion guide, a ball screw mechanism, a solenoid or an air cylinder, and such a linear motion mechanism moves the elevating member 33 in the Z direction. The elevating mechanism 51 operates in response to a control command from the control unit 90.

The base member 35 is moved up and down by upward and downward movements of the elevating member 33, and the plurality of lift pins 37 are moved up and down integrally with the base member 35. In this way, the transfer of the substrate S between the transfer unit 30 and the support tray 15 is realized. More specifically, as shown by dotted lines in FIG. 1, the substrate S is transferred with the support tray 15 pulled out to the outside of the chamber. To this end, the support tray 15 is provided with through holes 152, through which the lift pins 37 are inserted. If the base member 35 moves up, the upper ends of the lift pins 37 reach positions above the upper surface 151 of the support tray 15 through the through holes 152. In this state, the substrate S being conveyed by the external conveying device is transferred to the lift pins 37. The lift pins 37 move down, whereby the substrate S is transferred from the lift pins 37 to the support tray 15. The substrate S can be carried out in a procedure opposite to the above one.

Figure 2:
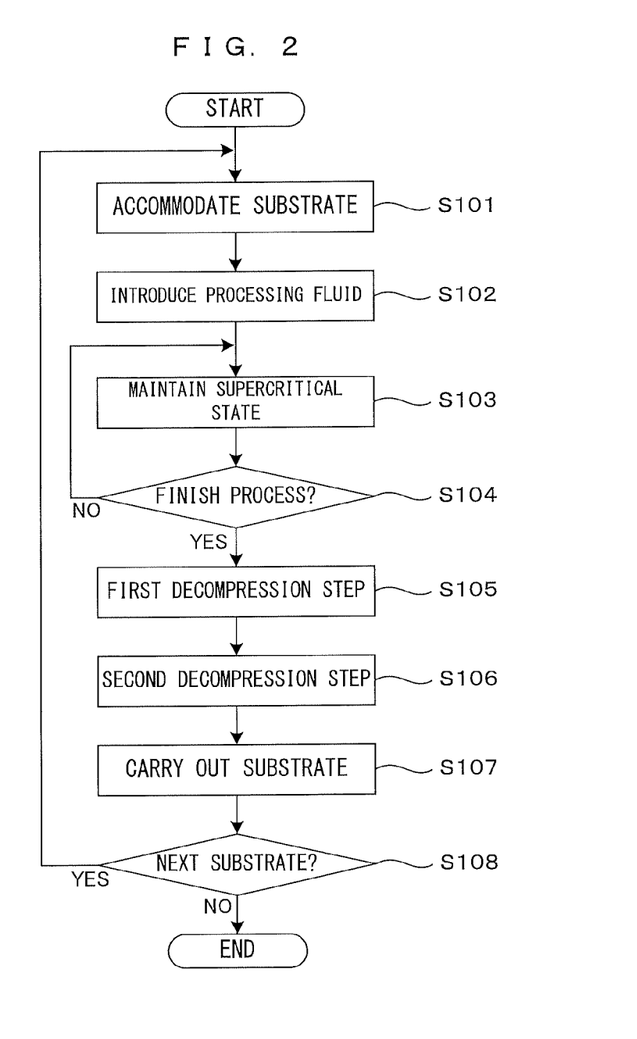
FIG. 2 is a flow chart showing a summary of a process performed by this substrate processing apparatus.

FIG. 2 is a flow chart showing a summary of a process performed by this substrate processing apparatus. This substrate processing apparatus 1 performs a supercritical drying process, i.e. a process of drying the substrate S cleaned with a cleaning liquid in a previous process. Specifically, this process is as follows. The substrate S to be processed is cleaned with the cleaning liquid in the previous process performed in another substrate processing apparatus constituting a substrate processing system. Thereafter, the substrate S is conveyed to the substrate processing apparatus 1 with a liquid film by an organic solvent such as isopropyl alcohol (IPA) formed on a surface.

For example, if a fine pattern is formed on the surface of the substrate S, the pattern may collapse due to surface tension of the liquid remaining on and adhering to the substrate S. Further, watermarks may remain on the surface of the substrate S due to incomplete drying. Further, the surface of the substrate S may be altered such as through oxidation by being exposed to outside air. To prevent such problems, the substrate S may be conveyed with the surface (pattern forming surface) of the substrate S covered by a liquid or solid surface layer.

For example, if the cleaning liquid contains water as a main component, conveyance is carried out with the liquid film formed by a liquid having a lower surface tension than the cleaning liquid and low corrosiveness to the substrate, e.g. an organic solvent such as IPA or acetone. That is, the substrate S is conveyed to the substrate processing apparatus 1 while being supported in a horizontal state and having the liquid film formed on the upper surface thereof. Here, it is assumed that IPA is used as an example of the liquid film material.

The substrate S conveyed by the unillustrated conveying device is accommodated into the processing chamber 12 (Step S101). Specifically, the substrate S is conveyed with the pattern forming surface serving as the upper surface and the upper surface covered by a thin liquid film. As shown by dotted lines in FIG. 1, the lift pins 37 move up with the lid member 13 moved to the (−Y) side and the support tray 15 pulled out. The conveying device transfers the substrate S to the lift pins 37. The lift pins 37 move down, whereby the substrate S is placed on the support tray 15. When the support tray 15 and the lid member 13 integrally move in the (+Y) direction, the support tray 15 supporting the substrate S is accommodated into the processing space SP in the processing chamber 12 and the opening 121 is closed by the lid member 13.

In this state, carbon dioxide serving the processing fluid is introduced in a gas phase state into the processing space SP (Step S102). Outside air enters the processing space SP when the substrate S is carried in, but it can be replaced by introducing the processing fluid in the gas phase. Further, by injecting the processing fluid in the gas phase, a pressure in the processing chamber 12 increases.

Note that, in the process of introducing the processing fluid, the processing fluid is continually discharged from the processing space SP. That is, the processing fluid is discharged from the processing space SP by the fluid collector 55 also while the processing fluid is being introduced by the fluid supplier 57. In this way, the processing fluid used for the process is discharged without convection in the processing space SP, thereby preventing impurities such as the remaining liquid taken into the processing fluid from adhering to the substrate S again.

If the supply amount of the processing fluid is more than the discharge amount, the density of the processing fluid in the processing space SP increases and the chamber internal pressure increases. Conversely, if the supply amount of the processing fluid is less than the discharge amount, the density of the processing fluid in the processing space SP decreases and the inside of the chamber is decompressed. The supply of the processing fluid into the processing chamber 12 and the discharge thereof from the processing chamber 12 are performed based on a supply/discharge recipe prepared in advance. That is, the control unit 90 controls the fluid supplier 57 and the fluid collector 55 based on the supply/discharge recipe, whereby supply and discharge timings, flow rates and the like of the processing fluid are adjusted.

If the pressure of the processing fluid in the processing space SP increases and exceeds a critical pressure, the processing fluid enters a supercritical state in the chamber. That is, due to a phase change in the processing space SP, the processing fluid transitions from the gas phase to the supercritical state. Note that the processing fluid in the supercritical state may be supplied from outside. By introducing the supercritical fluid into the processing space SP, the organic solvent such as IPA covering the substrate S is replaced by the supercritical fluid. The organic solvent separated from the surface of the substrate S is discharged with the processing fluid in a state dissolved in the processing fluid and removed from the substrate S. That is, the processing fluid in the supercritical state has a function of replacing the organic solvent adhering the substrate S as the liquid to be replaced and discharging it from the chamber 12. By maintaining a state, where the processing space SP is filled with the supercritical fluid, for a predetermined time (Step S103), the liquid to be replaced adhering to the substrate S can be replaced by the processing fluid and discharged from the chamber.

If the replacement of the liquid to be replaced by the supercritical fluid is finished in the processing chamber 12 (Step S104), the processing fluid in the processing space SP is discharged and the substrate S is dried. Specifically, by increasing the discharge amount of the fluid from the processing space SP, the inside of the processing chamber 12 filled with the processing fluid in the supercritical state is decompressed (Steps S105, S106). In this embodiment, a two-stage decompression process is performed, i.e. a first decompression step (Step S105) and a second decompression step (S106) are performed. By doing so, the processing space SP is finally decompressed to an atmospheric pressure. Differences of these two decompression steps are described in detail later.

In the decompression process, the supply of the processing fluid may be stopped or a small amount of the processing fluid may continue to be supplied. By decompressing the processing space SP from the state filled with the supercritical fluid, the processing fluid undergoes a phase change from the supercritical state to a gas phase. By discharging the vaporized processing fluid to outside, the substrate S is dried. At this time, a decompression rate is regulated so as not to create a solid phase and a liquid phase due to a sudden temperature drop. In this way, the processing fluid in the processing space SP is directly vaporized from the supercritical state and discharged to outside. Therefore, the formation of a gas-liquid interface on the substrate S having the exposed surface after drying is avoided.

As just described, in the supercritical drying process of this embodiment, the liquid adhering to the substrate S can be efficiently replaced and prevented from remaining on the substrate S by changing the phase of the processing fluid to the gas phase and discharging the processing fluid after the processing space SP is filled with the processing fluid in the supercritical state. Moreover, the substrate can be dried while avoiding problems caused due to the formation of the gas-liquid interface such as the contamination of the substrate by adhering impurities and pattern collapse.

The processed substrate S is delivered to a subsequent process (Step S107). That is, the lid member 13 moves in the (−Y) direction, whereby the support tray 15 is pulled out to outside from the processing chamber 12 and the substrate S is transferred to the external conveying device via the transfer unit 30. At this time, the substrate S is in the dried state. The content of the subsequent process is arbitrary. Unless there is a substrate to be processed next (NO in Step S108), the process is finished. If there is another substrate to be processed (YES in Step S108), return is made to Step S101, the substrate S is newly received and the above process is repeated.

If the next substrate S is successively processed after the process for one substrate S is finished, a tact time can be shortened as follows. That is, after the support tray 15 is pulled out and the processed substrate S is carried out, the support tray 15 is accommodated into the processing chamber 12 after a new unprocessed substrate S is placed thereon. Further, by reducing the number of opening and closing the lid member 13 in this way, an effect of suppressing a temperature change in the processing chamber 12 due to the entrance of outside air is also obtained.

Next, why the decompression process is performed in two stages in this embodiment is described. For the decompression process after the supercritical process, it is sufficient for the processing fluid in the supercritical state to undergo a phase transition to a gas phase without via a liquid phase and be discharged to the outside of the chamber. Thus, if only the processing for one substrate is considered, it can be said that the chamber internal temperature when the processing is finished needs not be particularly managed. However, in the case of consecutively processing a plurality of substrates as described next, the chamber internal temperature when the processing for one substrate is finished affects a processing result of the substrate to be processed next.

Figure 3:
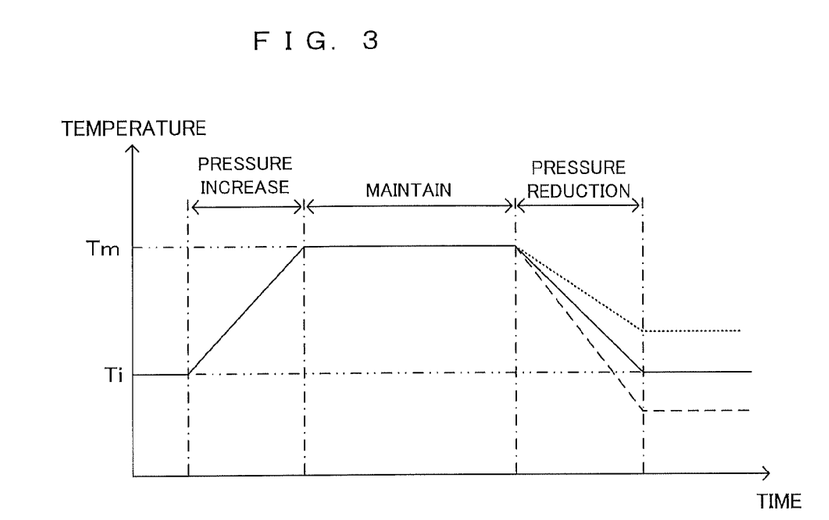
FIG. 3 is a chart schematically showing a temperature change in the chamber in the supercritical process.

FIG. 3 is a chart schematically showing a temperature change in the chamber in the supercritical process. The chamber internal temperature immediately after the substrate S is accommodated into the processing space SP of the processing chamber 12 is an initial temperature Ti. From this state, the processing fluid is introduced into the processing space SP, whereby the pressure in the chamber is increased and the temperature in the chamber gradually increases. By continuing for a given period a state where the chamber internal temperature is maintained at a temperature Tm higher than the critical temperature of the processing fluid, the substrate S is subjected to the supercritical process. The density of the supercritical processing fluid largely varies depending on temperature, and a density change leads to a variation of the replacement efficiency. Thus, the temperature during the processing for one substrate S is desirably constant. Further, to stabilize processing quality for a plurality of substrates, the temperature during the processing for each substrate is desirably equal.

After the processing by the supercritical processing fluid, the chamber internal temperature also decreases in the process of decompressing the processing space SP and finally reducing the pressure of the processing space SP to the atmospheric pressure. At this time, if the temperature when the decompression is finished is equal to the initial temperature Ti as shown by a solid line in FIG. 3, a temperature change in the processing for the other substrate to be successively processed is thought to be substantially the same. On the other hand, unless the chamber internal temperature during the decompression is properly managed, the processing is possibly finished at a temperature higher than the initial temperature Ti, for example, as shown by a dotted line or at a temperature lower than the initial temperature Ti as shown by a broken line in some cases.

Then, the initial temperature differs between the processing for the previous substrate and the processing for the next substrate and the temperature during the processing changes differently. As a result, a situation where the processing quality differs for each substrate possibly occurs. Particularly, if the processing is finished at a temperature higher than the initial temperature, the temperature of the supercritical processing fluid becomes excessively high in the processing for the next substrate, the density of the processing fluid decreases and the replacement efficiency decreases. That is, a problem of deteriorating the processing quality occurs. Further, every time the processing is repeated, thermal energy is accumulated in the processing chamber 12 and the temperature of the processing space SP gradually increases.

To solve this problem, the progress of the decompression is so controlled that the temperature in the chamber at a decompression end time has an appropriate value. The decompression end time mentioned here specifically means a time at which the pressure in the chamber is substantially reduced to the atmospheric pressure. Specific modes of the decompression steps of this embodiment are described in more detail below.

Figure 4:
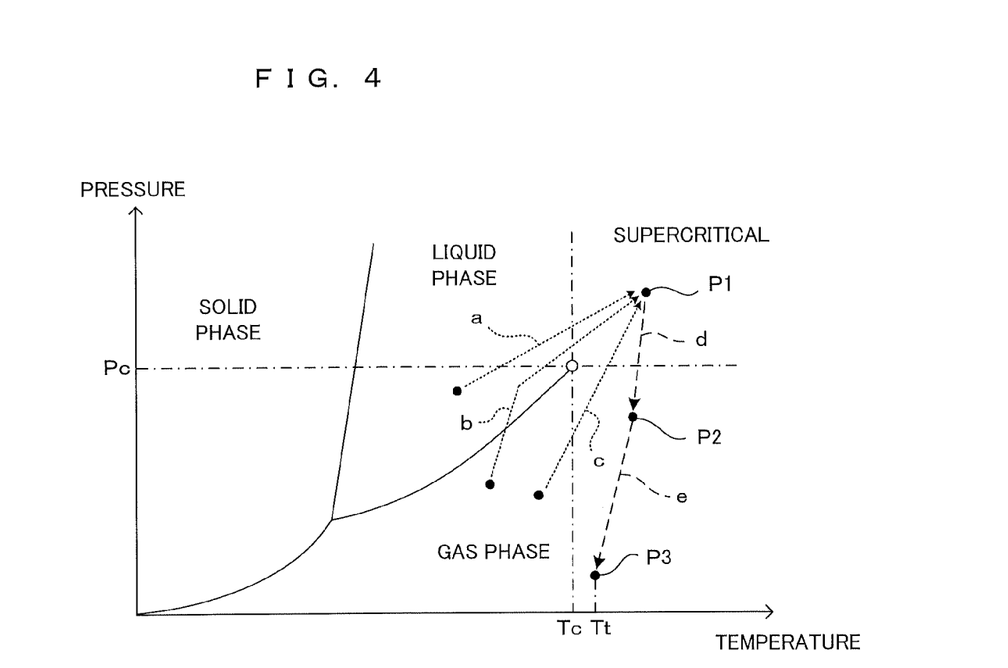
FIG. 4 is a phase chart showing a phase change in the supercritical process.

FIG. 4 is a phase chart showing a phase change in the supercritical process. In filling the chamber with the supercritical fluid to perform the supercritical process, the processing fluid set in the supercritical state in advance may be introduced into the processing chamber. However, it is realistic to introduce the processing fluid in the more easily handleable liquid or gas phase since the density of the supercritical fluid is largely changed by a temperature or pressure change as described above. That is, the processing fluid is introduced in the gas or liquid phase and the phase thereof is transitioned to the supercritical state in the chamber. In this case, as shown by arrows a to d in FIG. 4, various pressure and temperature changes of the processing fluid are considered.

In FIG. 4, a white circle symbol represents a critical point of carbon dioxide, which is the processing fluid of this embodiment. Reference signs Pc, Tc respectively denote a critical pressure and a critical temperature. Further, a point P represents a pressure and a temperature targeted in the supercritical process. From the perspective of processing efficiency, the point P is preferably close to the critical point (white circle symbol).

The arrow a corresponds to a case where the processing fluid in the liquid phase is introduced. More specifically, the arrow a indicates a case where the processing fluid in a liquid state having a higher pressure than the critical pressure Pc and a lower temperature than the critical temperature Tc is caused to transition to the supercritical state by being heated in the chamber. At this time, the pressure and temperature of the processing fluid are controlled not to cause the phase transition to the gas phase. Note that a pressure of the processing fluid introduced in the liquid phase may be higher than the critical pressure Pc.

Further, arrows b, c correspond to cases where the processing fluid in the gas phase is introduced. More specifically, the arrows b, c represent cases where the gaseous processing fluid having a lower pressure than the critical pressure Pc and a lower temperature than the critical temperature Tc is transferred to the supercritical state by being pressurized and heated in the chamber. Out of these, the arrow b represents a case of a supercritical transition from the gas phase via the liquid phase, and the arrow c represents a case of a transition from the gas phase to the supercritical state without via the liquid phase.

As just described, there are various possible methods for bringing the introduced processing fluid to the supercritical state (point P1) having a higher pressure than the critical pressure Pc and a higher temperature than the critical temperature Tc. On the other hand, the decompression process after the end of the supercritical process desirably has contents taking the following three points into account.

(1) The processing fluid undergoes a phase transition from the supercritical state to the gas phase without via the liquid phase.
(2) The chamber internal temperature at the decompression end time has an appropriate value.
(3) Decompression to the atmospheric pressure is performed in as short a time as possible as long as the points (1) and (2) are satisfied.

The point (1) is a requirement for the purpose of not causing a pattern collapse also in a substrate formed with a fine pattern. Further, the point (2) is a requirement for the purpose of stabilizing the processing quality for a plurality of substrates. Further, the point (3) is a requirement for the purpose of improving the throughput of the processing.

Accordingly, in this embodiment, the decompression process is divided into two stages respectively corresponding to the purposes of the points (1) and (2) and the purpose of the point (3) is accomplished by individually optimizing the respective stages. That is, in a first stage (first decompression step shown in Step S105 of FIG. 2) of the decompression process, the progress of the decompression is controlled so that the chamber internal temperature does not fall below the critical temperature Tc to accomplish the purpose of the point (1). Specifically, as shown by a broken-line arrow d in FIG. 4, the decompression is so controlled that a state of the processing fluid transitions from a point P1 where "both the pressure and temperature exceed a critical point (i.e. the processing fluid is in the supercritical state)" to a point P2 where "the temperature is higher than the critical temperature Tc and the pressure is lower than the critical pressure Pc". In this way, the processing fluid undergoes a phase transition from the supercritical state to the gas phase without via the liquid phase.

On the other hand, in a second stage (second decompression step shown in Step S106 of FIG. 2) of the decompression process, the decompression is controlled using the chamber internal temperature at the decompression end time as an index to accomplish the purpose of the point (2). That is, in a state transition from the point P2 to a point P3 indicated by a broken-line arrow e in FIG. 4, the progress of the decompression is so controlled that the temperature at the point P3 reaches a target temperature Tt set in advance. At this point of time, the chamber internal pressure is below the critical pressure Pc. Thus, the transition of the processing fluid to the liquid phase needs not be considered unless an operation of causing a very extreme temperature drop is performed.

Although the target temperature Tt is higher than the critical temperature Tc in an example of FIG. 4, it may be lower than the critical temperature Tc. In terms of bringing the processing fluid to the supercritical state in a short time in a pressure increasing process, the target temperature Tt is desirably higher than the critical temperature Tc. On the other hand, the chamber internal temperature at a processing start time may be lower than the critical temperature Tc since the temperature inevitably increases in the pressure increasing process and the temperature of the processing fluid during the supercritical process is preferably low in terms of replacement efficiency.

Further, in terms of preventing the processing fluid introduced into the processing space SP from undergoing a phase transition against a sudden temperature change, a difference between the temperature of the processing fluid to be introduced and the chamber internal temperature is preferably small. The target temperature Tt and the temperature of the processing fluid may be determined from this perspective. As just described, various ways of thinking are possibly established for the setting of the target temperature Tt. It is a main focus of this embodiment to execute a decompression control using the target temperature Tt set in this way as an index.

Note that the initial temperature Ti at the processing start time and the target temperature Tt at the processing end time are preferably equal to stably perform the processing for a plurality of substrates. By doing so, temperature changes in a plurality of processings can be made equal and the processing quality can be stabilized. Further, since the inside of the chamber is at a temperature suitable to receive the next substrate when the processing for the previous substrate is finished, the processing for the next substrate can be immediately started. In this way, an improvement in throughput can be realized.

A temperature drop caused by the adiabatic expansion of the processing fluid can be utilized to reduce the temperature in the chamber having reached a high temperature due to the supercritical process. That is, the temperature of the processing fluid is reduced by quickly expanding the processing fluid by discharging the processing fluid filled in the processing space SP as a high-pressure gas at a relatively high discharge rate. In this way, the inner wall surface of the chamber facing the processing space SP can be cooled. By properly setting the discharge rate, it is possible to control a temperature drop rate at this time and finally reduce the temperature in the chamber to the target temperature Tt.

In the decompression process focusing on the transition from the supercritical state to the gas phase without via the liquid phase, the discharge rate of the processing fluid needs to be relatively gentle to prevent the transition to the liquid phase due to a temperature drop. Therefore, the decompression to the atmospheric pressure takes a long time if the decompression is continued with the discharge rate at this time maintained.

On the other hand, the processing fluid after the transition to the gas phase can be discharged at a higher discharge rate, whereby a time required for the decompression can be shortened. By actively utilizing a temperature drop caused by the adiabatic expansion of the processing fluid at this time, the chamber internal temperature at the decompression end time can be optimized. To enable this, the two-stage decompression as described above is performed in this embodiment.

Figure 5:
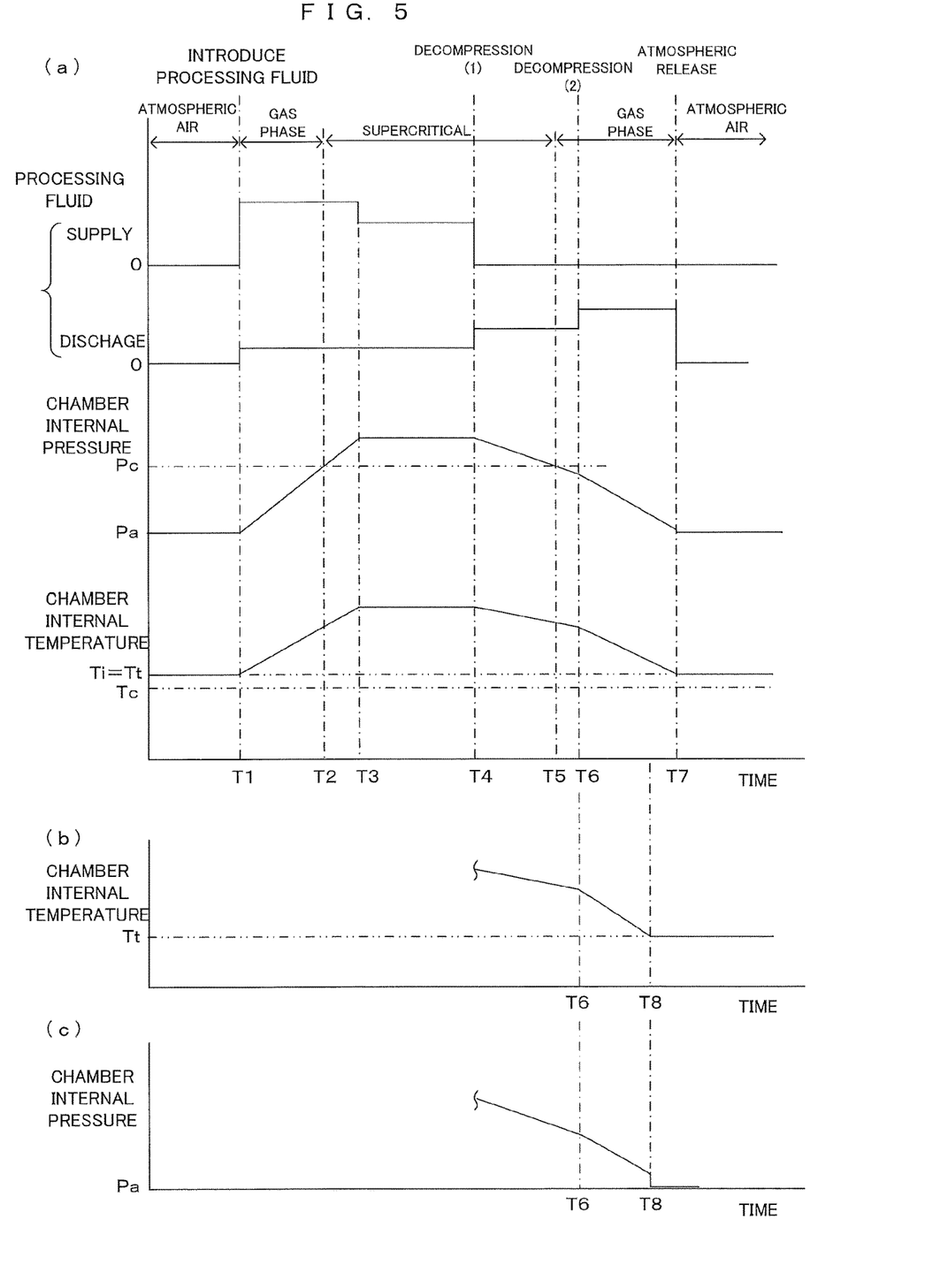
FIG. 5 is a timing chart showing a state change of each part in the supercritical process.

FIG. 5 is a timing chart showing a state change of each part in the supercritical process. More specifically, FIG. 5(a) shows a relationship between supply and discharge timings of the processing fluid based on the supply/discharge recipe determined in advance and state changes in the processing chamber 12 associated with these timings. Further, FIGS. 5(b) and 5(c) show modifications of the relationship. First, the supply/discharge recipe specifying the supply and discharge timings of the processing fluid and the amounts of the processing fluid is described with reference to FIG. 5(a).

In an initial state, the lid member 13 is opened to accommodate the substrate S into the processing chamber 12 and the processing space SP is open to an atmosphere. That is, the chamber internal pressure is almost an atmospheric pressure Pa and sufficiently smaller than the critical pressure Pc. On the other hand, since a critical temperature Tc of carbon dioxide serving as the processing fluid is close to a room temperature, the initial temperature Ti in the chamber is close to the critical temperature Tc. Although the initial temperature Ti is slightly higher than the critical temperature Tc in FIG. 5(a), the initial temperature Ti is possibly lower than the critical temperature Tc in some cases.

After the substrate S is accommodated, the processing fluid in the gas phase starts to be introduced into the processing space SP at a predetermined flow rate at time T1. At this time, the processing fluid is also discharged at a certain rate. By setting a supply flow rate larger than a discharge flow rate, the chamber internal pressure gradually increases. At time T2 at which the chamber internal pressure reaches the critical pressure Pc, the processing fluid undergoes a phase transition to the supercritical state if the chamber internal temperature is higher than the critical temperature Tc.

At time T3, the supply amount of the processing fluid is adjusted to an amount for maintaining the chamber internal pressure substantially constant. In this way, the pressure and temperature in the chamber filled with the processing fluid in the supercritical state are kept substantially constant. At time T4, the decompression is started. That is, while the supply amount of the processing fluid is largely reduced, the discharge amount is increased. Thus, the processing fluid is excessively discharged and the chamber internal pressure is reduced. Although the chamber internal temperature is also reduced according to the expansion of the processing fluid, the decompression is performed at a relatively gentle decompression rate so that the chamber internal temperature does not fall below the critical temperature Tc. By controlling the discharge rate of the processing fluid according to a pressure change in the chamber, the decompression rate can be adjusted. The decompression process at this time is the "first decompression step" and written as "DECOMPRESSION (1)" in FIG. 5.

At time T5 at which the chamber internal pressure falls to or below the critical pressure Pc, the processing fluid undergoes a phase transition to the gas phase. Thereafter, at time T6, the discharge rate of the processing fluid is increased, whereby the decompression process transfers to the "second decompression step". The second decompression step is written as "DECOMPRESSION (2)" in FIG. 5. For example, a transfer from the first decompression step to the second decompression step can be realized by executing a control to increase the discharge rate of the processing fluid when a detection value of the chamber internal pressure reaches a specified value lower than the critical temperature Pc. Further, the control to increase the discharge rate of the processing fluid may be executed when the detection value of the chamber internal pressure is lower than the critical pressure Pc and a detection value of the chamber internal temperature is reduced to a specified value higher than the critical temperature Tc.

At and after time T7 at which the chamber internal pressure is reduced substantially to the atmospheric pressure Pa, the processing space SP can be opened to the atmosphere and the substrate S can be carried out. The decompression rate (discharge rate of the processing fluid) is so adjusted that the temperature in the chamber is reduced due to a sudden decompression and the chamber internal temperature reaches the target temperature Tt at time T7.

In this example, the target temperature Tt and the initial temperature Ti are set to be equal. Accordingly, the chamber internal temperature returns to the initial temperature Ti when the decompression process is finished. Thus, even if a new unprocessed substrate is immediately received and processed after the processed substrate is carried out, temperature conditions in each processing are the same. In this way, a processing result equivalent to that of the processing for the previous substrate can be obtained. That is, in this embodiment, a plurality of substrates can be processed with stable processing quality.

Note that, in the example of FIG. 5(*a*), the chamber internal temperature is gradually reduced according to the progress of the decompression in the second decompression step, and the chamber internal temperature is also reduced to the target temperature Tt at time T7 at which the pressure is reduced to the atmospheric pressure. However, what is required is that the chamber internal temperature is the target temperature Tt at a timing at which the processing space SP can be opened to the atmosphere, i.e. the processed substrate S can be taken out from the processing chamber 12. In this sense, a time at which the chamber internal pressure is reduced to the atmospheric pressure and a time at which the chamber internal temperature reaches the target temperature Tt need not be the same.

For example, as in the modification shown in FIG. 5(*b*), the chamber internal temperature may be reduced to the target temperature Tt before time T7 at which the chamber internal pressure is reduced to the atmospheric pressure. In this case, after time T8 at which the chamber internal temperature reaches the target temperature Tt, the discharge rate of the pressure is preferably reduced to suppress a further temperature drop caused by the adiabatic expansion of the processing fluid.

Further, even if the chamber internal temperature is higher than the atmospheric pressure at time T8 at which the chamber internal temperature reaches the target temperature Tt, for example, as in the modification shown in FIG. 5(*c*), the chamber internal pressure can be reduced to the atmospheric pressure at once if that difference is not very large. For example, the processing space SP may be opened to the atmosphere by opening the lid member 13, whereby the chamber internal pressure becomes the atmospheric pressure. As just described, if the chamber internal pressure is sufficiently reduced to a pressure close to the atmospheric pressure in advance, a large temperature change is thought not to be created by a pressure change due to release to the atmosphere or the like thereafter. Therefore, if the chamber internal pressure is sufficiently reduced when the chamber internal temperature reaches the target temperature Tt, the processing space SP can be opened to the atmosphere without waiting for a drop to the atmospheric pressure.

A control at this time is for monitoring the pressure and temperature in the chamber and stopping the decompression and immediately releasing the processing space SP to the atmosphere if the chamber internal pressure is below the specified value at time T8 at which the chamber internal temperature reaches the target temperature Tt. If the chamber internal pressure is higher than the specified value at time T8, the decompression can be stopped when the chamber internal pressure is reduced to the specified value.

As described above, in this embodiment, the decompression process after the execution of the supercritical process is performed in two stages including the first decompression step and the second decompression step. In the first decompression step, the processing fluid in the supercritical state is transferred to the gas phase without via the liquid phase. On the other hand, in the second decompression step, the inside of the chamber is decompressed to the atmospheric pressure while the chamber internal temperature after the processing is properly kept, utilizing a cooling effect by the adiabatic expansion of the processing fluid after the transition to the gas phase. Control factors (pressure, temperature) focused for the decompression control and the discharge rate of the processing fluid are different from each other between the processings in these two stages.

By doing so, the processing result can be made satisfactory by directly transferring the supercritical processing fluid to the gas phase and discharging the processing fluid. Further, the processing results for the plurality of substrates can be stabilized by properly keeping the chamber internal temperature after the processing. Thus, in this embodiment, the plurality of substrates can be processed satisfactorily and with stable processing quality.

As described above, in the substrate processing apparatus 1 of the above embodiment, the processing chamber 12 functions as a "chamber" of the invention, the opening 121 corresponds to an "opening" of the invention. Further, the processing space SP corresponds to an "internal space" of the invention. Further, the support tray 15 and the lid member 13 respectively function as a "support tray" and a "lid part" of the invention. Further, the fluid supplier 57, the fluid collector 55 and the control unit 90 respectively function as a "fluid supplier, a "fluid discharger", and a "controller" of the invention. Further, the detectors 173, 174 function as a "detector" of the invention.

Further, in the substrate processing method (FIG. 2) of the above embodiment, Steps S102 to S104 correspond to a "supercritical process step" of the invention. Steps S105, S106 respectively correspond to a "first decompression step" and a "second decompression step" of the invention.

Note that the invention is not limited to the above embodiment and various changes other than the aforementioned ones can be made without departing from the gist of the invention. For example, the decompression control in the first and second decompression steps is not limited to the control for adjusting the discharge rate of the processing fluid based on the detection results of the detectors 173, 174 as described above, and may be more simply executed as follows.

In the supercritical process of the above embodiment, the chamber internal temperature after the processing is managed. Thus, temperature change profiles can be substantially the same in the case of successively processing a plurality of substrates. In other words, a temperature change in the chamber from the introduction to the discharge of the processing fluid is reproducible. From this, if the pressure and temperature changes in the chamber are measured in advance by a preliminary experiment, the discharge rate of the processing fluid and the duration thereof in each of the first and second decompression steps can be empirically determined from that result. If a discharge control is executed using this result, a decompression control similar to that of the above embodiment can be realized even without using the pressure and temperature detection results during the processing.

Further, a control of the initial temperature when the first substrate is processed in the case of successively processing the plurality of substrates is not mentioned in the description of the above embodiment. However, the initial temperature at this time is also desirably kept at a proper temperature when processing stability is considered. To this end or to suppress a temperature change due to a disturbance, the substrate processing apparatus 1 may be further provided with a configuration for temperature stabilization. For example, a heater may be provided on the surface of or inside the processing chamber 12. Further, the support tray 15 may include a built-in heater.

Further, various chemical substances used in the processing of the above embodiment are some examples, and various other chemical substances can also be used instead of these if those chemical substances conform to the above technical idea of the invention.

As the specific embodiment has been illustrated and described above, the temperature in the internal space can be reduced by the adiabatic expansion of the processing fluid in the internal space in the second decompression step in the substrate processing method according to the invention. A temperature drop by the adiabatic expansion is a phenomenon inevitably occurring in the decompression step. By executing the decompression control taking this into account, the decompression can be finished by reducing the temperature in the chamber to the target temperature.

Further, for example, the target temperature may be equal to or higher than the critical temperature. In the case of processing the next substrate after the processing of one substrate is finished, the introduced processing fluid can be brought to the supercritical state in a short time and the processing can be efficiently performed if the temperature in the chamber is kept at the critical temperature or higher.

Further, for example, the second decompression step can be started in a case that the pressure of the internal space is reduced to a predetermined value lower than the critical pressure in the first decompression step. In the first decompression step, the decompression is so performed that the chamber internal temperature does not fall below the critical temperature. Therefore, it can be said that the processing fluid in the chamber can be transferred from the supercritical state to the gas phase without via the liquid phase if the pressure in the internal space becomes lower than the critical pressure. If the second decompression step is performed at this timing, the pressure and temperature of the processing fluid can be further reduced while the transition to the liquid phase is avoided.

Further, for example, the discharge rate may be reduced after the temperature of the internal space is reduced to the target temperature in the second decompression step. If quick discharge is further continued in this state, the chamber internal temperature is further reduced. By reducing the discharge rate, the pressure of the internal space can be reduced while suppressing a further temperature drop.

On the other hand, for example, in the second decompression step, the internal space may be released to the atmosphere after the temperature of the internal space is reduced to the target temperature. Even if the internal space is not decompressed to the atmospheric pressure at this point of time, a further temperature drop caused by release to the atmosphere is tiny if a difference between the temperature of the internal space and the atmospheric pressure is small. Accordingly, a processing time can be shortened by release to the atmosphere when the temperature of the internal space is reduced to the target temperature.

Further, this substrate processing method may be configured such that a plurality of substrates are successively processed by carrying out the substrate after the internal space is opened to the atmosphere, carrying an unprocessed substrate into the chamber and performing the supercritical process step. Since, in the invention, the chamber internal temperature is managed when the processing for one substrate is finished, the initial temperature when the next substrate is processed can be set at a proper value. Thus, in the case of successively processing the plurality of substrates in this way, processing results of those can be stabilized.

Further, the substrate processing apparatus according to the invention may be provided with a detector for detecting the pressure and temperature of the internal space, and the controller can control the fluid supplier and the fluid discharger based on detection results of the detector. According to such a configuration, the substrate can be satisfactorily processed by controlling the progress of the decompression using at least one of the detection results on the pressure and temperature of the internal space. Moreover, the plurality of substrates can be stably processed by properly managing the chamber internal temperature at the processing end time.

Further, for example, an opening communicating with the internal space may be provided in a side surface of the chamber. In this case, a support tray insertable into the internal space via the opening while supporting the substrate in a horizontal posture and a lid part for closing the opening with the support tray accommodated in the internal space may be further provided. According to such a configuration, the substrate can be carried in and out by inserting and withdrawing the support tray into and from the internal space. Further, a high-pressure processing can be performed with the internal space set in an airtight state by the lid part closing the opening. Furthermore, by separating the lid part from the opening, the release of the internal space to the atmosphere can be realized.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

INDUSTRIAL APPLICABILITY

This invention can be applied to processings in general for processing a substrate using a processing fluid introduced into a chamber. For example, the invention can be suitably applied to a single substrate processing of processing substrates such as semiconductor substrates successively one by one by a supercritical fluid.

REFERENCE SIGNS LIST 1 substrate processing apparatus
12 processing chamber (chamber)
13 lid member (lid part)
15 support tray
55 fluid collector (fluid discharger)
57 fluid supplier
90 control unit (controller)
121 opening
173, 174 detector
S substrate
S102-S104 supercritical process step
S105 first decompression step
S106 second decompression step
SP processing space (internal space)

The invention claimed is:

1. A substrate processing method for processing a substrate by a processing fluid in a supercritical state in a chamber, the substrate processing method comprising:
introducing the processing fluid into an internal space of the chamber accommodating the substrate and processing the substrate by keeping a pressure of the internal space higher than a critical pressure of the processing fluid and keeping a temperature of the internal space higher than a critical temperature of the processing fluid;
decompressing the internal space to a pressure lower than the critical pressure and higher than an atmospheric pressure while keeping the temperature of the internal space equal to or higher than the critical temperature by discharging the processing fluid from the chamber; and
decompressing the internal space by discharging the processing fluid at a discharge rate higher than in the first decompression step, wherein
the discharge rate is so controlled that the temperature of the internal space when the pressure of the internal space is reduced to the atmospheric pressure becomes a predetermined target temperature.

2. The substrate processing method according to claim 1, wherein in discharging the processing fluid at the discharge rate, the temperature of the internal space is reduced by an adiabatic expansion of the processing fluid in the internal space.

3. The substrate processing method according to claim 1, wherein the target temperature is equal to or higher than the critical temperature.

4. The substrate processing method according to claim 1, wherein discharging the processing fluid at the discharge rate is started in a case that the pressure of the internal space is reduced to a predetermined value lower than the critical pressure.

5. The substrate processing method according to claim 1, wherein the discharge rate is reduced after the temperature of the internal space is reduced to the target temperature.

6. The substrate processing method according to claim 1, wherein the internal space is released to an atmosphere after the temperature of the internal space is reduced to the target temperature.

7. The substrate processing method according to claim 1, being configured such that a plurality of substrates are successively processed by carrying out the substrate after the internal space is opened to an atmosphere, carrying an unprocessed substrate into the chamber and processing the substrate by the processing fluid in the supercritical state.

8. A substrate processing apparatus for processing a substrate by a processing fluid in a supercritical state, the substrate processing apparatus comprising:
a chamber having an internal space for accommodating the substrate;
a fluid supplier which supplies the processing fluid into the internal space of the chamber;
a fluid discharger which discharges the processing fluid from the internal space; and
a controller which controls the fluid supplier and the fluid discharger, wherein the controller is configured to execute the substrate processing method according to claim 1.

9. The substrate processing apparatus according to claim 8, further comprising a detector which detects the pressure and the temperature of the internal space.

10. The substrate processing apparatus according to claim 8, wherein an opening communicating with the internal space is provided in a side surface of the chamber, the substrate processing apparatus further comprising:
a support tray insertable into the internal space via the opening while supporting the substrate in a horizontal posture; and
a lid which closes the opening with the support tray accommodated in the internal space.

* * * * *